United States Patent
Kurafuji (10) Patent No.: US 10,599,589 B2
(45) Date of Patent: Mar. 24, 2020

(54) SEMICONDUCTOR DEVICE AND FLASH-MEMORY CONTROL METHOD

(71) Applicant: RENESAS ELECTRONICS CORPORATION, Tokyo (JP)

(72) Inventor: Takashi Kurafuji, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/970,083

(22) Filed: May 3, 2018

(65) Prior Publication Data
US 2018/0373651 A1    Dec. 27, 2018

(30) Foreign Application Priority Data
Jun. 27, 2017   (JP) .................. 2017-125270

(51) Int. Cl.
| | | |
|---|---|---|
| G06F 12/00 | (2006.01) | |
| G06F 13/16 | (2006.01) | |
| G06F 9/48 | (2006.01) | |
| G11C 16/06 | (2006.01) | |
| G11C 7/10 | (2006.01) | |
| G11C 16/22 | (2006.01) | |
| G11C 16/10 | (2006.01) | |
| G11C 16/16 | (2006.01) | |

(52) U.S. Cl.
CPC ........ *G06F 13/1668* (2013.01); *G06F 9/4812* (2013.01); *G11C 7/1042* (2013.01); *G11C 7/1075* (2013.01); *G11C 16/06* (2013.01); *G11C 16/10* (2013.01); *G11C 16/16* (2013.01); *G11C 16/22* (2013.01)

(58) Field of Classification Search
None
See application file for complete search history.

(56) References Cited

U.S. PATENT DOCUMENTS

| | | | |
|---|---|---|---|
| 2003/0033490 A1* | 2/2003 | Gappisch | G06F 13/1663 711/150 |
| 2009/0132846 A1* | 5/2009 | Song | G06F 1/14 713/502 |
| 2015/0199137 A1* | 7/2015 | Shin | G06F 3/0611 711/103 |

FOREIGN PATENT DOCUMENTS

JP    2008-034045 A    2/2008

* cited by examiner

*Primary Examiner* — Daniel D Tsui
(74) *Attorney, Agent, or Firm* — McDermott Will & Emery LLP (57) ABSTRACT

According to one embodiment, a memory controller is configured so that when the memory controller controls a writing/erasing process for a flash memory performed by a first or second master, the memory controller can prohibit, while the first master is performing the writing/erasing process for the flash memory, an interruption of the writing/erasing process in execution, the interruption resulting from access to the flash memory by the second master.

10 Claims, 11 Drawing Sheets

| OPERATION FOR FLASH MEMORY | WRITE DATA TO MEMORY CONTROLLER | | | |
|---|---|---|---|---|
| | FIRST DATA | SECOND DATA | THIRD TO (N+2)th DATA | (N+3)th DATA |
| (A) DATA WRITING<br>• 4-BYTE DATA WRITING : N=2<br>• 16-BYTE DATA WRITING : N=8 | H' E8 | H' 02(=N)<br>H' 08(=N) | DATA THAT IS WRITTEN INTO FLASH MEMORY | H' D0 |
| (B) DATA ERASING | H' 20 | H' D0 | — | — |
| (C) INTERRUPT PROHIBITION + DATA WRITING<br>• 4-BYTE DATA WRITING : N=2<br>• 16-BYTE DATA WRITING : N=8 | H' 17 | H' 02(=N)<br>H' 08(=N) | DATA THAT IS WRITTEN INTO FLASH MEMORY | H' D0 |
| (D) INTERRUPT PROHIBITION + DATA ERASING | H' DF | H' D0 | — | — |

| OPERATION FOR FLASH MEMORY | WRITE DATA TO MEMORY CONTROLLER | | | |
|---|---|---|---|---|
| | FIRST DATA | SECOND DATA | THIRD TO (N+2)th DATA | (N+3)th DATA |
| (A) DATA WRITING<br>・4-BYTE DATA WRITING : N=2<br>・16-BYTE DATA WRITING : N=8 | H' E8 | H' 02(=N)<br>H' 08(=N) | DATA THAT IS WRITTEN INTO FLASH MEMORY | — |
| (B) DATA ERASING | H' 20 | H' D0 | — | — |

SEMICONDUCTOR DEVICE AND FLASH-MEMORY CONTROL METHOD

CROSS-REFERENCE TO RELATED APPLICATIONS

This application is based upon and claims the benefit of priority from Japanese patent application No. 2017-125270, filed on Jun. 27, 2017, the disclosure of which is incorporated herein in its entirety by reference.

BACKGROUND

The present disclosure relates to a semiconductor device and a flash-memory control method. For example, the present disclosure relates to a control technique that is used when a plurality of masters perform writing/erasing processes for a flash memory.

A type of a semiconductor device including a plurality of masters (e.g., a plurality of master processing units) may be configured so that the plurality of masters use one common flash memory. In a semiconductor device having such a configuration, for example, a memory controller controls access to the flash memory from each of the masters.

Japanese Unexamined Patent Application Publication No. 2008-34045 discloses a technique for interrupting/resuming a writing/erasing process for a flash memory.

In general, when a certain master is performing a writing/erasing process for a flash memory, other masters cannot perform any of reading, writing, and erasing processes for that flash memory. It should be noted that it takes time to write/erase data to/from a flash memory. Therefore, in some cases, when a certain master is performing a writing/erasing process for a flash memory as described above, other masters cannot access the flash memory for a long time and need to wait a long time.

To solve the above-described problem, Japanese Unexamined Patent Application Publication No. 2008-34045 discloses a semiconductor device in which even when a writing/erasing process is being performed for a flash memory, this writing/erasing process can be interrupted so that other processes (e.g., a reading, writing, or erasing process) can be performed for the flash memory.

SUMMARY

However, the present inventors have found the following problem. That is, such writing/erasing processes for flash memories may include an important process. When such an important writing/erasing process is interrupted halfway through the process, a problem related to the whole system could occur, making the operation of the semiconductor device unstable.

Other problems and novel features will be apparent from the description of this specification and the accompanying drawings.

According to one embodiment, a memory controller is configured so that when the memory controller controls a writing/erasing process for a flash memory performed by a first or second master, the memory controller can prohibit, while the first master is performing the writing/erasing process for the flash memory, an interruption of the writing/erasing process in execution, the interruption resulting from access to the flash memory by the second master.

According to the above-described embodiment, it is possible to provide a semiconductor device including a flash memory disposed therein and a flash-memory control method capable of achieving a stable operation in the semiconductor device.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

A first embodiment is explained hereinafter with reference to the drawings.

Figure 1:
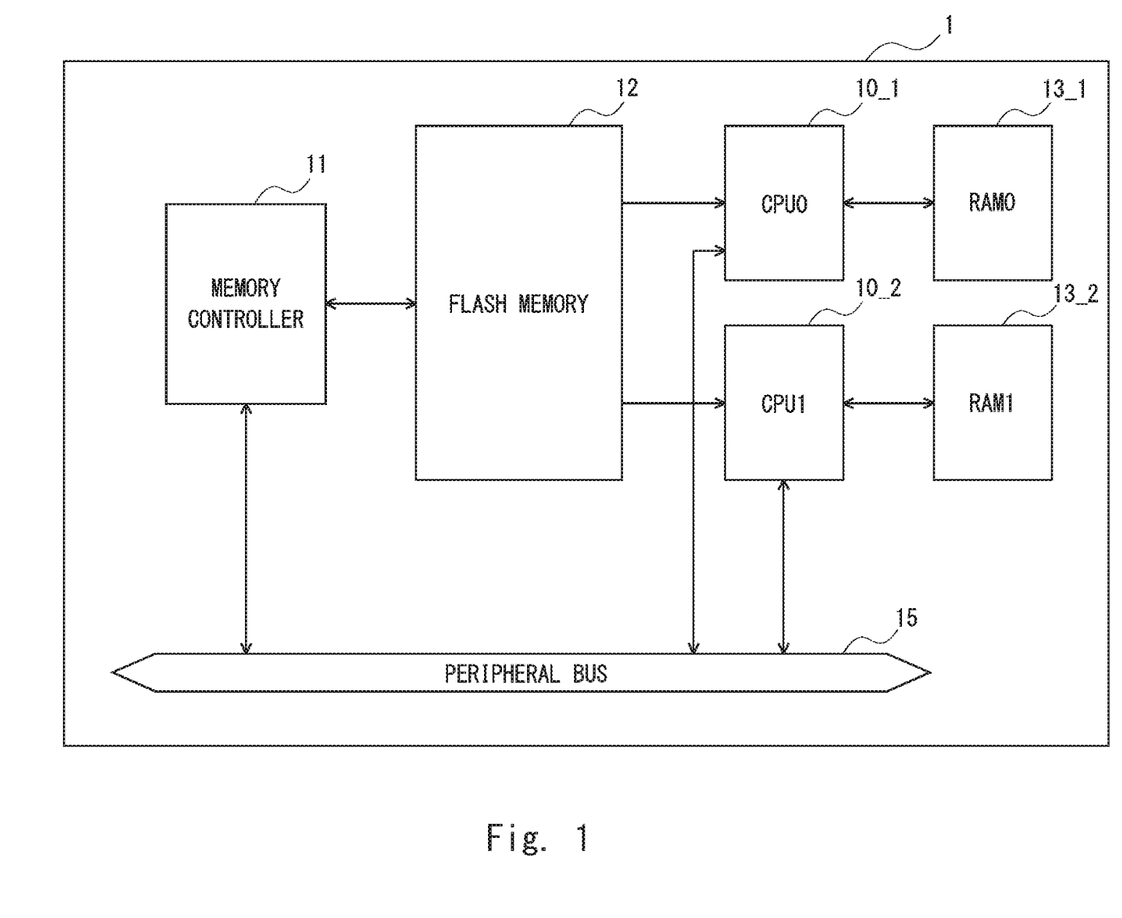
FIG. 1 is a block diagram showing a semiconductor device according to a first embodiment.

FIG. 1 is a block diagram showing a semiconductor device according to the first embodiment. As shown in FIG. 1, the semiconductor device 1 according to this embodiment includes CPUs (Central Processing Units) 10_1 and 10_2, a memory controller 11, a flash memory 12, RAMs (Random Access Memories) 13_1 and 13_2, and a peripheral bus 15. The semiconductor device 1 according to this embodiment is, for example, a microcontroller. Note that in this specification, the CPUs 10_1 and 10_2 may also be referred to as CPUs 0 and 1, respectively. Further, the CPUs 10_1 and 10_2 may also be collectively referred to as CPUs.

Further, in this specification, "a writing/erasing process for a flash memory" means "a writing process for a flash memory" or "an erasing process for a flash memory". In this specification, when "a writing process for a flash memory" and "an erasing process for a flash memory" are not distinguished from each other, they are described as being "a writing/erasing process for a flash memory".

Each of the CPUs (i.e., masters) 10_1 and 10_2 performs a predetermined process based on data stored in the flash memory 12. That is, each of the CPUs 10_1 and 10_2 is a processor that loads data (a program) stored in the flash memory 12 and performs a predetermined process by executing the loaded program. By executing a program as described above, each of the CPUs 10_1 and 10_2 can function as a microcontroller 1. Note that each of the CPUs 10_1 and 10_2 may execute a program stored in the flash memory 12 after loading it into a respective one of the RAMs 13_1 and 13_2.

The semiconductor device 1 shown in FIG. 1 has a configuration including CPUs 10_1 and 10_2 as an example of a configuration including a plurality of CPUs. Each of the CPUs 10_1 and 10_2 functions as an independent master. Specifically, the CPU 10_1 functions as a first master and the CPU 10_2 functions as a second master.

The RAMs 13_1 and 13_2 are provided so as to correspond to the CPUs 10_1 and 10_2, respectively. Specifically, the CPU 10_1 is connected to the RAM 13_1. The CPU 10_2 is connected to the RAM 13_2. The RAMs 13_1 and 13_2 are volatile memories in which data used by the CPUs 10_1 and 10_2, respectively, are stored. The data stored in the RAMs 13_1 and 13_2 include, for example, data that is used when the CPUs 10_1 and 10_2, respectively, execute programs. Further, as described above, programs loaded from the flash memory 12 may be stored in the RAMs.

The flash memory 12 is a nonvolatile memory in which data that is used in the CPUs 10_1 and 10_2 is stored. Examples of the data stored in the flash memory 12 include program data executed by the CPUs 10_1 and 10_2, flag data indicating a state of the flash memory 12, and security-key data.

The memory controller 11 controls access to the flash memory 12 from each of the CPUs 10_1 and 10_2. Specifically, the memory controller 11 controls a writing/erasing process for the flash memory 12 performed by each of the CPUs 10_1 and 10_2. That is, the memory controller 11 implements a flash-memory control method according to this embodiment.

The memory controller 11 is connected between each of the CPUs 10_1 and 10_2 and the flash memory 12. Specifically, the CPUs 10_1 and 10_2 are connected to the memory controller 11 through the peripheral bus 15. Further, the memory controller 11 is connected to the flash memory 12. Note that the flash memory 12 is configured so that the flash memory 12 can directly output data to each of the CPUs 10_1 and 10_2, but each of the CPUs 10_1 and 10_2 cannot directly access the flash memory 12.

That is, each of the CPUs 10_1 and 10_2 is configured so that it cannot write or erase data to or from the flash memory 12 without the intervention of the memory controller 11. Regarding data reading from the flash memory 12, each of the CPUs 10_1 and 10_2 may be configured so that it cannot read data from the flash memory 12 without the intervention of the memory controller 11 as in the case of the above-described writing/erasing process, or may be configured so that it can directly read data from the flash memory 12 without the intervention of the memory controller 11.

Figure 2:
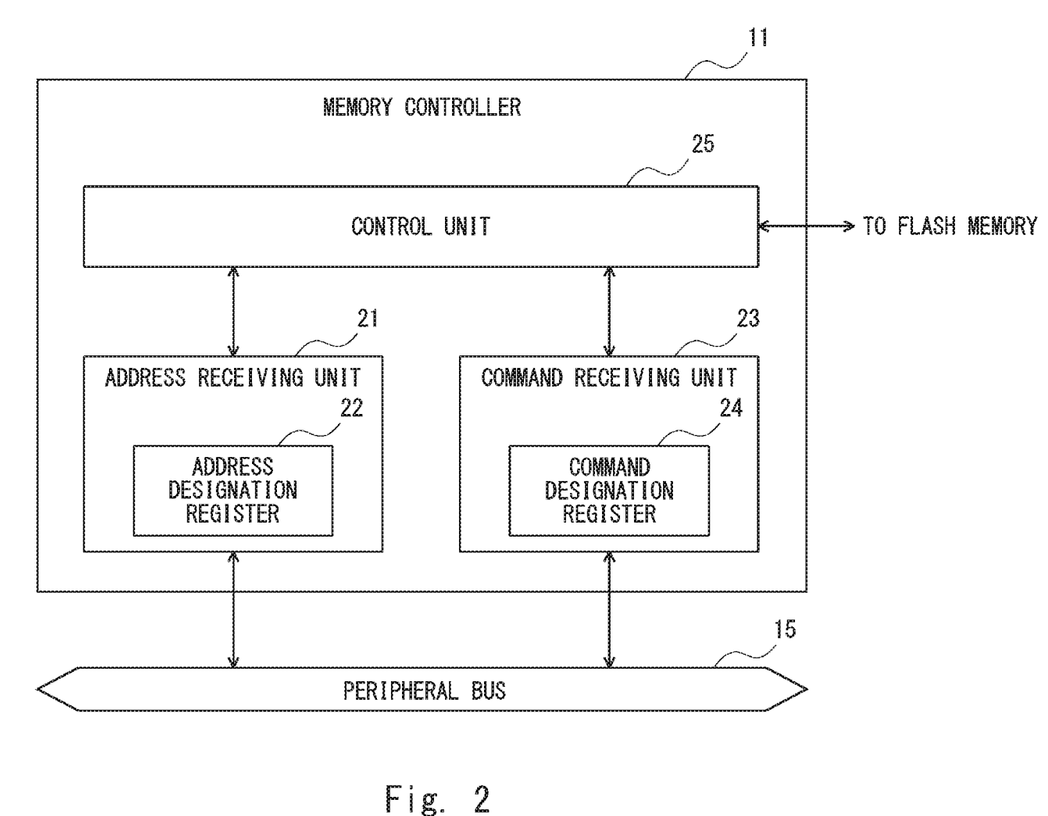
FIG. 2 is a block diagram showing a memory controller included in the semiconductor device according to the first embodiment.

Next, a configuration of the memory controller 11 is explained with reference to FIG. 2. As shown in FIG. 2, the memory controller 11 includes an address receiving unit 21, a command receiving unit 23, and a control unit 25.

The address receiving unit 21 receives address data transmitted from the CPU 10_1 or 10_2 through the peripheral bus 15. The address data is data indicating an address in the flash memory 12. As shown in FIG. 2, the address receiving unit 21 has an address designation register 22. The address designation register 22 is a register into which address data transmitted from the CPU 10_1 or 10_2 is written. The writing of address data transmitted from the CPU 10_1 or 10_2 into the address designation register 22 corresponds to the reception of the address data.

The command receiving unit 23 receives write data transmitted from the CPU 10_1 or 10_2 through the peripheral bus 15. The write data is data that is written by the CPU 10_1 or 10_2 to instruct (i.e., notify) the memory controller 11 about control that the memory controller 11 should perform. Examples of the control specified by the write data include control for writing data into the flash memory 12 and control for erasing data stored in the flash memory 12. Specifically, the CPU 10_1 or 10_2 specifies control that the memory controller 11 should perform by writing a series of write data into the memory controller 11 in a predetermined order. This series of write data corresponds to a command for designating the control that the memory controller 11 should perform. In the following explanation, write data may also be referred to as a command.

The command receiving unit 23 includes a command designation register 24. The command designation register 24 is a register into which write data transmitted from the CPU 10_1 or 10_2 is written. The writing of write data transmitted from the CPU 10_1 or 10_2 into the command designation register 24 corresponds to the reception of the write data.

The control unit 25 controls the flash memory 12. Specifically, the control unit 25 performs control corresponding to the series of write data (the command) written in the command designation register 24 for the address in the flash memory 12 indicated by the address data written in the address designation register 22.

Note that although FIG. 2 shows a configuration example in which the address designation register 22 and the command designation register 24 are separately provided, the embodiment is not limited to this configuration example. For example, both the address designation register 22 and the command designation register 24 may be formed by using one physical register. In such a case, for example, write data may be written into this register after address data is written into the register.

Figure 3:
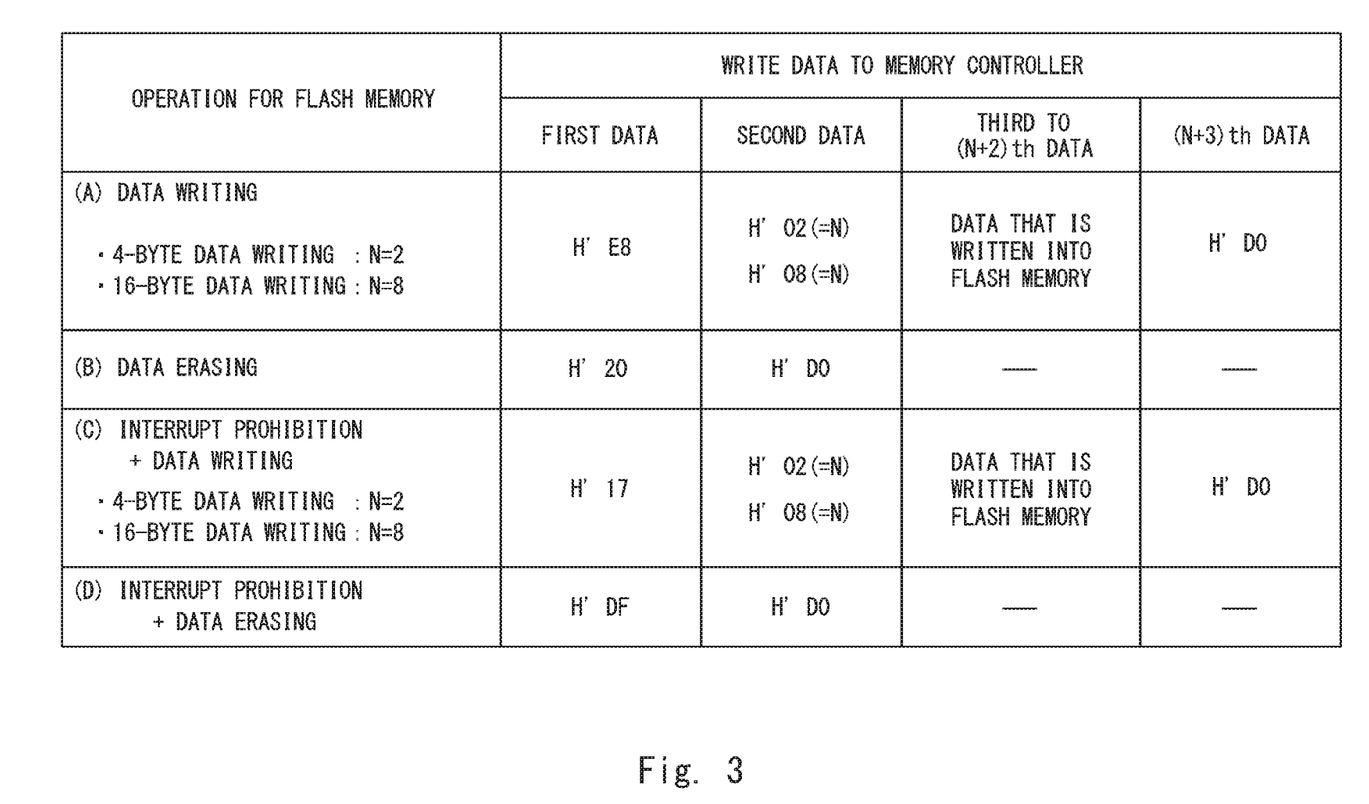
FIG. 3 is a table showing an example of commands used in the semiconductor device according to the first embodiment.

Next, an operation performed by the semiconductor device 1 according to this embodiment is explained. FIG. 3 is a table showing an example of commands used in the semiconductor device according to this embodiment. As shown in FIG. 3, "(A) data write command", "(B) data erase command", "(C) interrupt prohibition+data write command", and "(D) interrupt prohibition+data erase command" are prepared as commands for controlling the memory controller 11.

Firstly, an operation that is performed when data is written into the flash memory 12 is explained. In the following explanation, an example in which, as one of the CPUs 10_1 and 10_2, the CPU 10_1 writes data into the flash memory 12 is explained. However, the same explanation is applied to a case where the CPU 10_2 writes data into the flash memory 12.

When the CPU 10_1 writes data into the flash memory 12, it writes address data into the address designation register 22 through the peripheral bus 15 (see FIG. 2). As a result, an address in the address space of the flash memory 12 into which data is written is specified.

After that, the CPU 10_1 successively writes write data (i.e., a series of write data) indicating "(A) data write command" shown in FIG. 3 into the command designation register 24 (see FIG. 2). Specifically, when the CPU 10_1 writes 4-byte data into the flash memory 12, it successively writes a series of write data "H' E8", "H' 02", "4-byte data (i.e., writes 2-byte data twice: N=2)", and "H' D0" into the command designation register 24 in this order as shown in FIG. 3.

Further, when the CPU 10_1 writes 16-byte data into the flash memory 12, it successively writes a series of write data "H' E8", "H' 08", "16-byte data (i.e., writes 2-byte data eight times: N=8)", and "H' D0" into the command designation register 24 in this order as shown in FIG. 3. Note that "H'" means that a numerical value following it is expressed by hexadecimal notation.

In response to this, the control unit 25 of the memory controller 11 writes the data written in the command designation register 24 into the address in the address space of the flash memory 12 indicated by the address data written in the address designation register 22. That is, when the "H' 02" is written in the second writing, the control unit 25 writes the 4-byte data written in the third and fourth writing into an area having a size equivalent to four bytes starting from the address indicated by the address data. Further, when the "H' 08" is written in the second writing, the control unit 25 writes the 16-byte data written in the third to tenth writing into an area having a size equivalent to 16 bytes starting from the address indicated by the address data.

Next, an operation that is performed when data is erased from the flash memory 12 is explained. When the CPU 10_1 erases data from the flash memory 12, it writes address data into the address designation register 22 through the peripheral bus 15 (see FIG. 2). As a result, in the address space of the flash memory 12, an address of a block containing data to be erased is specified.

After that, the CPU 10_1 successively writes write data (i.e., a series of write data) indicating "(B) data erase command" into the command designation register 24. Specifically, the CPU 10_1 successively writes a series of write data "H' 20" and "H' D0" into the command designation register 24 in this order.

In response to this, the control unit 25 of the memory controller 11 erases the data contained in the block at the address in the address space of the flash memory 12 indicated by the address data written in the address designation register 22.

Figure 4:
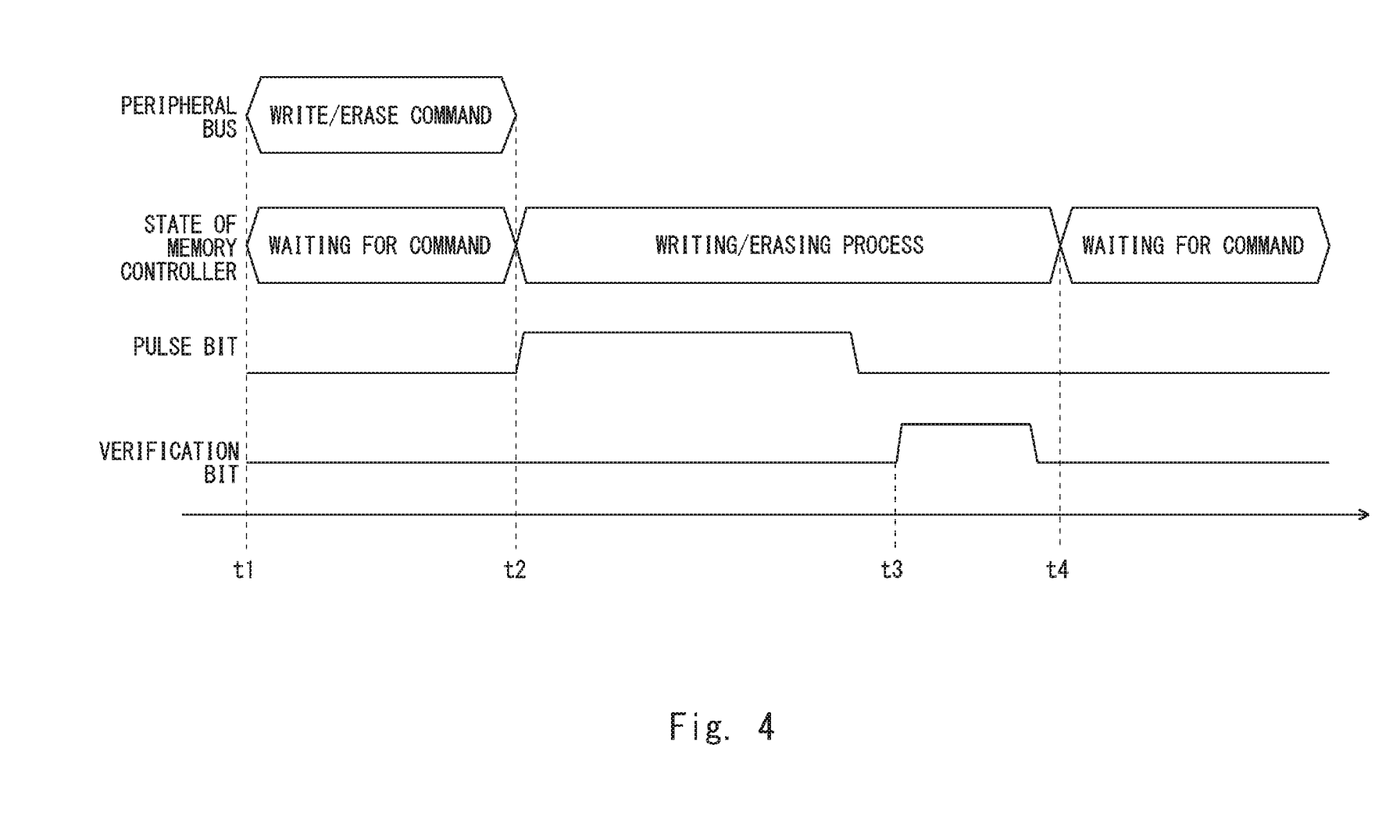
FIG. 4 is a timing chart for explaining an operation for a writing/erasing process for a flash memory.

FIG. 4 is a timing chart for explaining an operation for a writing/erasing process performed by the semiconductor device. The timing chart shown in FIG. 4 shows operations that are performed for "the writing of data into the flash memory 12" and "the erasing of data from the flash memory 12" explained above. Note that timing charts for "the writing of data into the flash memory 12" and "the erasing of data from the flash memory 12" are the same as each other. Therefore, in FIG. 4, both the write command and the erase command are expressed as a "write/erase command" and both the writing process and the erasing process are expressed as a "writing/erasing process". This also applies to timing charts shown in FIGS. 5, 6, 10 and 11.

When the memory controller 11 is not performing a writing/erasing process for the flash memory 12, it is in a waiting state (a command waiting state). In this state, when the CPU 10_1 outputs a write/erase command to the peripheral bus 15 (at a timing t1 in FIG. 4), the memory controller 11 receives the write/erase command through the peripheral bus 15. In this process, the CPU 10_1 also outputs address data to the peripheral bus 15.

Upon receiving the address data from the peripheral bus 15, the memory controller 11 writes the address data into the address designation register 22 (see FIG. 2). As a result, an address in the address space of the flash memory 12 into which data is written is specified.

Further, upon receiving the write/erase command from the peripheral bus 15, the memory controller 11 writes the write/erase command (specifically, "(A) data write command" or "(B) data erase command" shown in FIG. 3) into the command designation register 24 (see FIG. 2) (at a timing t2). In this way, the writing/erasing process is performed.

Specifically, the control unit 25 of the memory controller 11 performs the writing/erasing process corresponding to the command written in the command register specified 24 for the address indicated by the address data written in the address designation register 22. In this process, the memory controller 11 raises a pulse bit for indicating application of a write/erase pulse (a voltage) to the flash memory 12 to a high level for a predetermined period. As a result, the flash memory 12 starts the writing/erasing process.

Then, after the predetermined period has elapsed, the memory controller 11 lowers the pulse bit, which is being supplied to the flash memory 12, to a low level. As a result, the writing/erasing process for the flash memory 12 is finished. After that, at a timing t3, the memory controller 11 outputs a verification bit having a high level to the flash memory 12. As a result, it is verified whether or not the writing/erasing process for the flash memory 12 has been properly performed. Upon completing the verification process, the memory controller 11 becomes a waiting state (a command waiting state) again (at a timing t4).

Through the above-described operation, the writing/erasing process for the flash memory 12 is performed.

It should be noted that in the semiconductor device 1 having the multi-master configuration as shown in FIG. 1, the memory controller 11 controls access to the flash memory 12 from each of the masters (the CPUs 10_1 and 10_2). Further, the memory controller 11 can interrupt a writing/erasing process for the flash memory 12 performed by one of the masters (e.g., the CPU 10_1) so that the other master (e.g., the CPU 10_2) can access the flash memory 12 in the period in which the one of the masters (i.e., the CPU 10_1) is performing the writing/erasing process.

An operation that is performed when a writing/erasing process for the flash memory 12 is interrupted/resumed is explained hereinafter with reference to a timing chart shown in FIG. 5. Note that explanations of parts of the operation shown in FIG. 5 that are the same as those shown in FIG. 4 are omitted as appropriate.

Figure 5:
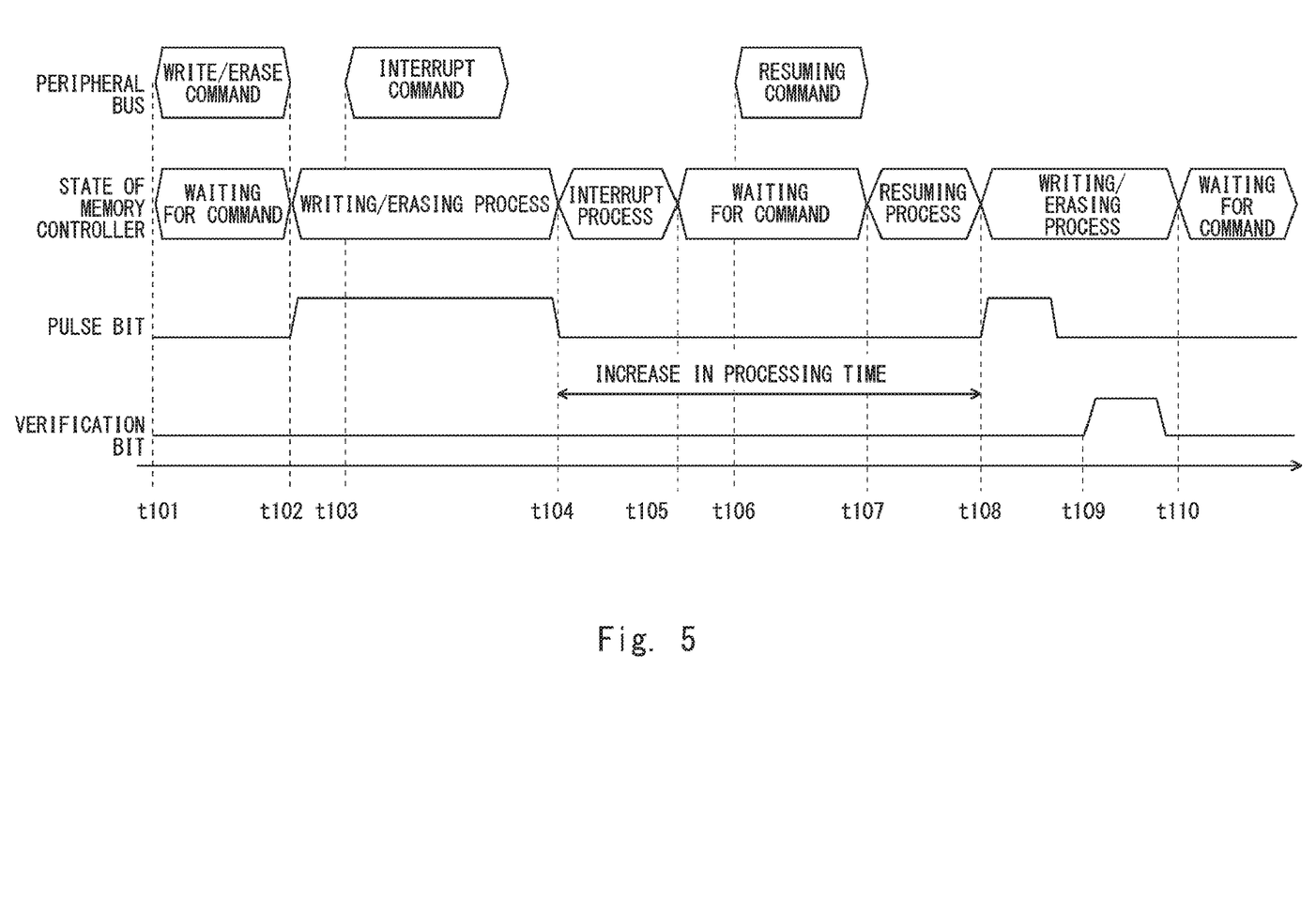
FIG. 5 is a timing chart for explaining an operation for interrupting/resuming a writing/erasing process to a flash memory.

As shown in FIG. 5, when the CPU 10_1 outputs a write/erase command to the peripheral bus 15 (at a timing t101), the memory controller 11 receives the write/erase command through the peripheral bus 15.

After that, the memory controller 11 performs a writing/erasing process corresponding to the command received from the peripheral bus 15 (at a timing t102). In this process, the memory controller 11 raises a pulse bit for indicating application of a write/erase pulse (a voltage) to the flash memory 12 to a high level for a predetermined period. As a result, the flash memory 12 starts the writing/erasing process.

After that, at a timing t103, when the CPU 10_2, which is the other master, outputs an interrupt command to the peripheral bus 15, the memory controller 11 receives the interrupt command through the peripheral bus 15. When the memory controller 11 receives the interrupt command while the pulse bit is at the high level, the memory controller 11 maintains the pulse bit at the high level for a predetermined time and then performs an interrupt process such as saving of address information (at a timing t104). After completing the interrupt process, the memory controller 11 enters a command waiting state (at a timing t105). While the interrupt process is being performed, the CPU 10_2, i.e., the other master can perform a reading/writing/erasing process for the flash memory 12 (this process is omitted in the figure).

After the process performed by the CPU 10_2, i.e., the other master is finished, the CPU 10_2 outputs a resuming command to the peripheral bus 15 (at a timing t106). Upon receiving the resuming command through the peripheral bus 15, the memory controller 11 performs a resuming process such as restoration of saved information (at a timing t107). After that, the memory controller 11 resumes the interrupted writing/erasing process (at a timing t108). In this process, the memory controller 11 raises a pulse bit for indicating application of a write/erase pulse (a voltage) to the flash memory 12 to a high level for the predetermined period again. As a result, the flash memory 12 starts the writing/erasing process.

Then, after the predetermined period has elapsed, the memory controller 11 lowers the pulse bit, which is being supplied to the flash memory 12, to a low level. As a result, the writing/erasing process for the flash memory 12 is finished. After that, at a timing t109, the memory controller 11 outputs a verification bit having a high level to the flash memory 12. As a result, it is verified whether or not the writing/erasing process for the flash memory 12 has been properly performed. Upon completing the verification process, the memory controller 11 becomes a waiting state (a command waiting state) again (at a timing t110).

FIG. 5 shows a series of operations that are performed in the case where while one of the masters, i.e., the CPU 10_1 is performing a writing/erasing process for the flash memory 12, the other master, i.e., the CPU 10_2 makes a request for an interrupting/resuming process to the memory controller 11. In some cases, when the other CPU, i.e., the CPU 10_2 performs an interrupting/resuming process as described above, a problem related to the whole system occurs.

For example, when the CPU 10_1 makes a request for a process for writing/erasing important data, such as security-key data used for a security process, to the memory controller 11 and then the CPU 10_2 uses the interrupt function, the writing/erasing process performed by the CPU 10_1 is interrupted. Under ordinary circumstances, the interrupted writing/erasing process performed by the CPU 10_1 is resumed through a resuming process. However, if some problem occurs during the interruption, the interrupted writing/erasing process performed by the CPU 10_1 is not resumed even though the resuming process is performed. In such a case, a write error occurs in the security-key data writing process and hence a problem related to the security may occur.

Further, when a process for interrupting/resuming a writing/erasing process for the flash memory 12 is performed as described above, the time required for the writing/erasing process increases. Specifically, as shown in FIG. 5, when an interrupting/resuming process is performed, a time period from the start of the interrupt process (at a timing t104) to the end of the resuming process (at a timing t108) is added in the writing/erasing process. Therefore, the time taken for the writing/erasing process increases.

In consideration of such a situation, the semiconductor device according to this embodiment has an additional function of prohibiting an interruption from occurring during a writing/erasing process for the flash memory 12. Specifically, the memory controller 11 is configured so that while one of the masters (the CPU 10_1) is performing a writing/erasing process for the flash memory 12, the memory controller 11 can prohibit an interruption of the currently-processed writing/erasing process resulting from access to the flash memory 12 by the other master (the CPU 10_2).

That is, when a command received from one of the masters (the CPU 10_1) prohibits an interrupt of a writing/erasing process, the memory controller 11 prohibits, while that master (the CPU 10_1) is performing a writing/erasing process for the flash memory 12, an interruption of the currently-processed writing/erasing process.

Specifically, the semiconductor device 1 according to this embodiment has a command(s) for prohibiting an interruption of a writing/erasing process in execution as a command(s) for controlling the memory controller 11. That is, as shown in FIG. 3, the semiconductor device 1 has "(C) interrupt prohibition+data write command" and "(D) interrupt prohibition+data erase command".

Figure 6:
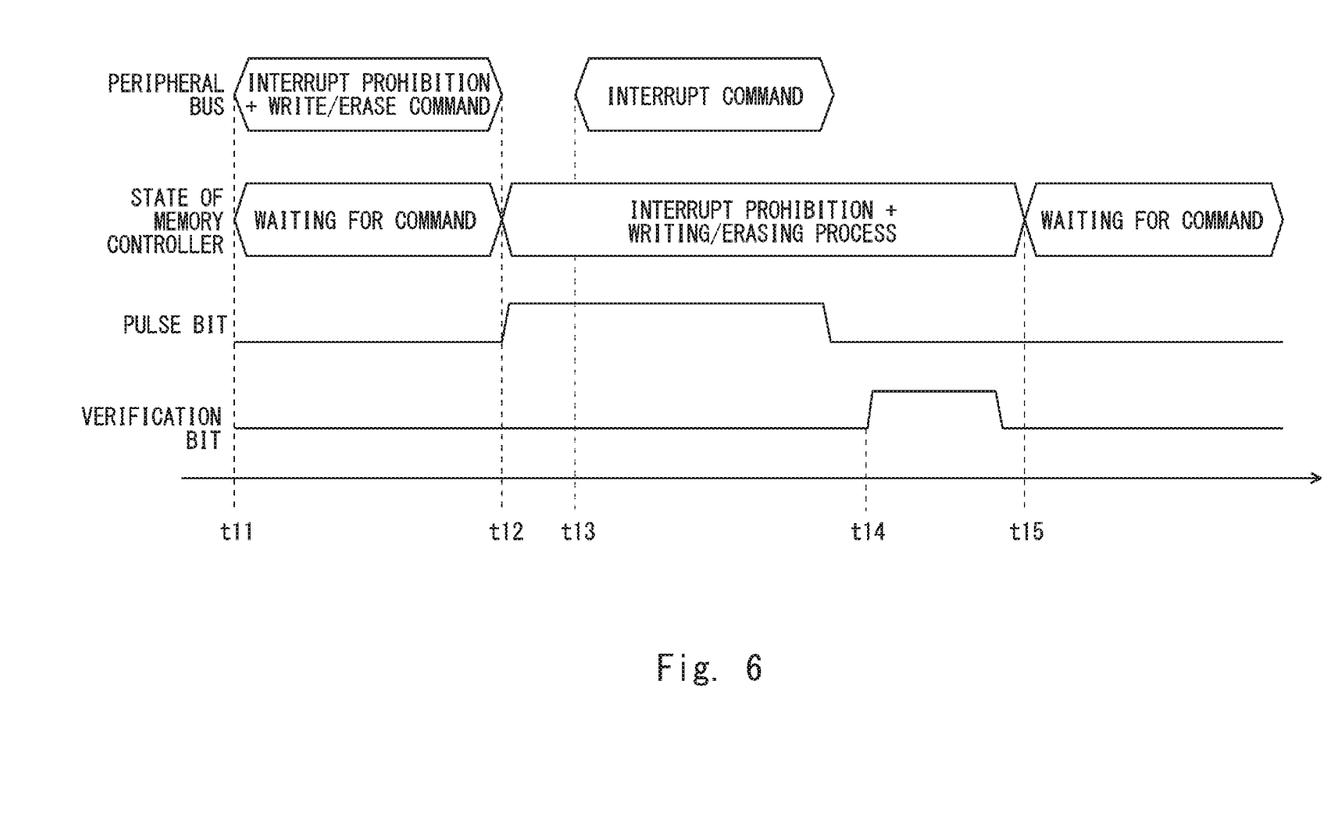
FIG. 6 is a timing chart for explaining an operation for a writing/erasing process for a flash memory.

Operations that are performed when "(C) interrupt prohibition+data write command" and "(D) interrupt prohibition+data erase command" shown in FIG. 3 are executed are explained hereinafter with reference to a timing chart shown in FIG. 6. Note that timing charts for "the writing of data into the flash memory 12" and "the erasing of data from the flash memory 12" are the same as each other. Therefore, in FIG. 6, both "(C) interrupt prohibition+data write command" and "(D) interrupt prohibition+data erase command" are expressed as "interrupt prohibition+data write/erase command". Further both "interrupt prohibition+data writing process" and "interrupt prohibition+data erasing process" are expressed as "interrupt prohibition+data writing/erasing process".

When the memory controller 11 is not performing a writing/erasing process for the flash memory 12, it is in a waiting state (a command waiting state). In this state, when the CPU 10_1 outputs an "interrupt+writing/erasing process command" to the peripheral bus 15 (at a timing t11 in FIG. 6), the memory controller 11 receives the "interrupt writing/erasing process command" through the peripheral bus 15. In this process, the CPU 10_1 also outputs address data to the peripheral bus 15.

Upon receiving the address data from the peripheral bus 15, the memory controller 11 writes the address data into the address designation register 22 (see FIG. 2). As a result, an address in the address space of the flash memory 12 into which data is written is specified. It should be noted that in the case of a data erasing process, data is erased on a block-by-block basis. Therefore, in the address space of the flash memory 12, an address of a block containing data to be erased is specified.

Further, upon receiving the "interrupt prohibition+writing/erasing process command" from the peripheral bus 15, the memory controller 11 writes an "interrupt prohibition+writing/erasing process command" (specifically, the "(C) interrupt prohibition+data write command" or the "(D) interrupt prohibition+data erase command" shown in FIG. 3) into the command designation register 24 (see FIG. 2) (at a timing t12). In this way, an "interrupt prohibition+writing/erasing process" is performed.

Specifically, the control unit 25 of the memory controller 11 performs the writing/erasing process corresponding to the command written in the command register specified 24 for the address indicated by the address data written in the address designation register 22. In this process, the memory controller 11 raises a pulse bit for indicating application of a write/erase pulse (a voltage) to the flash memory 12 to a high level for a predetermined period. As a result, the flash memory 12 starts the writing/erasing process. Note that operations that are performed when writing/erasing processes are performed by using the aforementioned commands are similar to those that are performed when writing and erasing processes are performed by using the "(A) data write command" and "(B) data erase command" shown in FIG. 3.

Further, a command indicating "interrupt prohibition" is written in the command designation register 24 of the memory controller 11. Specifically, in the case of the "(C) interrupt prohibition+data write command" shown in FIG. 3, first write data "H' 17" means the "interrupt prohibition+data writing process". Further, in the "(D) interrupt prohibition+data erase command", first write data "H' DF" means the "interrupt prohibition+data erasing process".

In this case, while the CPU 10_1 is performing a writing/erasing process for the flash memory 12, the memory controller 11 prohibits an interruption of the currently-processed writing/erasing process. That is, as shown in FIG. 6, at a timing t13, even when the CPU 10_2 provides an interrupt command to the memory controller 11 through the peripheral bus 15, the memory controller 11 ignores this interrupt command provided by the CPU 10_2 and continues the writing/erasing process for the flash memory 12 performed by the CPU 10_1.

After the predetermined period has elapsed, the memory controller 11 lowers the pulse bit, which is being supplied to the flash memory 12, to a low level. As a result, the writing/erasing process for the flash memory 12 is finished. After that, at a timing t14, the memory controller 11 outputs a verification bit having a high level to the flash memory 12. As a result, it is verified whether or not the writing/erasing process for the flash memory 12 has been properly performed. Upon completing the verification process, the memory controller 11 becomes a waiting state (a command waiting state) again (at a timing t15).

Through the above-described operation, the "interrupt prohibition+writing/erasing process" for the flash memory 12 is performed.

As described above, the semiconductor device according to this embodiment is configured so that while one of the masters (the CPU 10_1) is performing a writing/erasing process for the flash memory 12, this writing/erasing process performed by the one of the masters (the CPU 10_1) is not interrupted even when access to the flash memory 12 is requested by the other master (the CPU 10_2).

In this way, it is possible to prevent a process for writing/erasing important data to/from the flash memory from being interrupted halfway through the process and hence to prevent a problem related to the whole system from occurring. Therefore, it is possible to provide a semiconductor device including a flash memory disposed therein and a flash-memory control method capable of achieving a stable operation in the semiconductor device.

Further, by preventing the writing/erasing process for the flash memory from being interrupted halfway through the process, it is possible to prevent the time required for the writing/erasing process for the flash memory from increasing.

Further, in this embodiment, for example, when data that the master (the CPU 10_1 or 10_2) writes/erases to/from the flash memory contains at least one of flag data and security-key data, an interruption of this writing/erasing process in execution may be prohibited.

That is, since such flag data or security-key data is important data, if an error occurs when such important data is being written/erased to/from the flash memory, a serious problem related to the whole system could occur. Therefore, it is preferable that when such important data is written/erased to/from the flash memory, an interruption of this writing/erasing process in execution is prohibited.

However, if interruptions of writing/erasing processes in execution are entirely prohibited, flexibility of the system decreases. Therefore, in this embodiment, when important data such as flag data or security-key data is written/erased to/from the flash memory, an interruption of this writing/erasing process in execution may be prohibited, whereas when other data (unimportant ordinary data) is written/erased to/from the flash memory, an interruption of this writing/erasing process in execution may be permitted.

That is, by allowing a command to be used to be selected from the commands shown in FIG. 3 according to importance of data to be processed, it is possible to stabilize operations performed in the system while maintaining the flexibility of the system. Specifically, when important data is written/erased to/from the flash memory, the "(C) interrupt prohibition+data write command" or the "(D) interrupt prohibition+data erase command" shown in FIG. 3 is selected, whereas when other data (unimportant ordinary data) is written/erased to/from the flash memory, the "(A) data write command" or the "(B) data erase command" shown in FIG. 3 is selected.

Further, only the requirement for the semiconductor device according to this embodiment is to include a plurality of masters. That is, the number of masters in the semiconductor device may be arbitrarily determined. In the semiconductor device 1 shown in FIG. 1, a configuration example including two CPUs 10_1 and 10_2 is shown, in which each of the CPUs 10_1 and 10_2 functions as an independent master. However, the semiconductor device according to this embodiment may include three or more CPUs.

Figure 7:
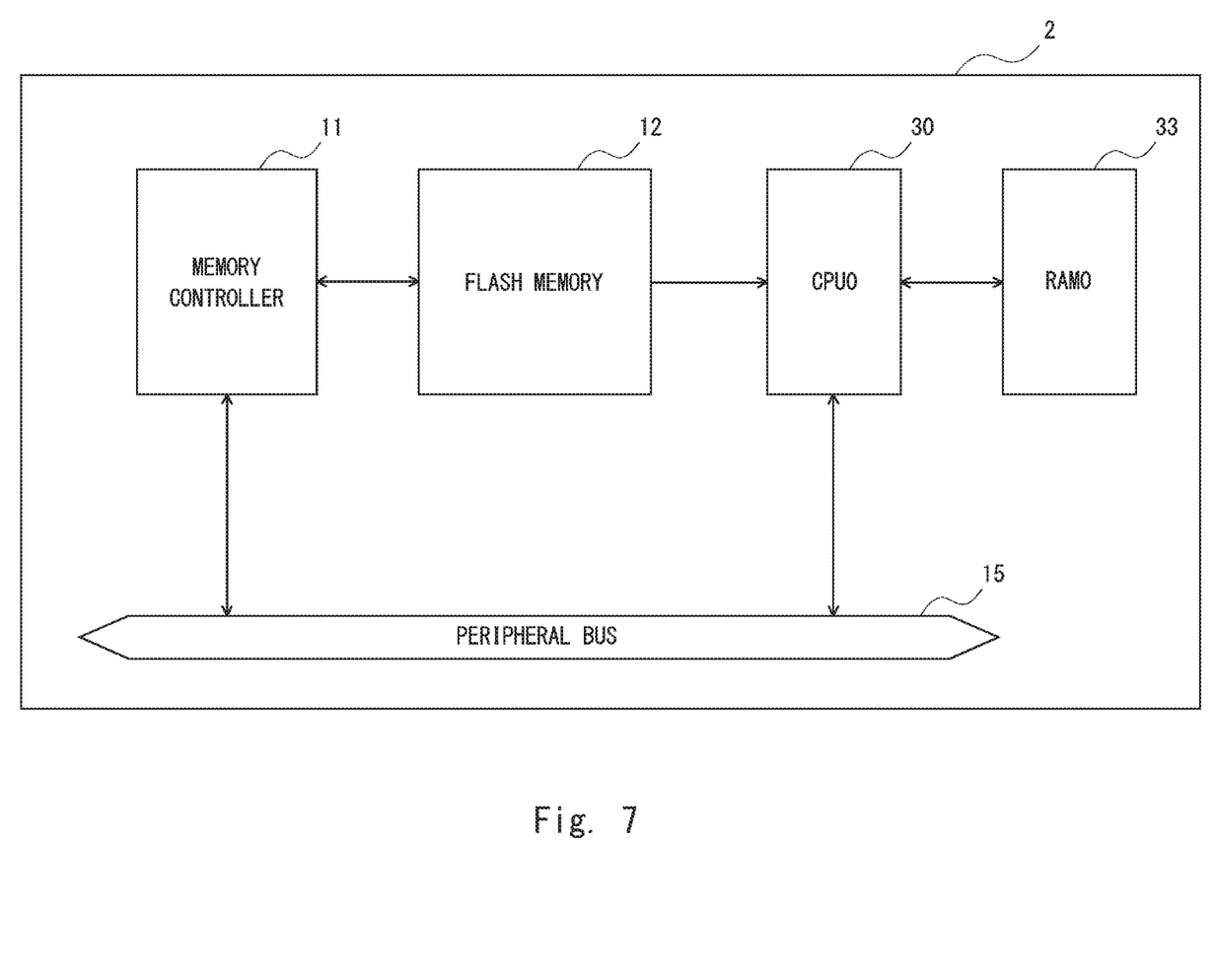
FIG. 7 is a block diagram showing another configuration example of a semiconductor device according to the first embodiment.

Further, in this embodiment, as shown as a semiconductor device 2 in FIG. 7, the semiconductor device may include one CPU 30 and one RAM 33. In this case, the one CPU 30 is configured so as to function as a plurality of masters. That is, although the CPU 30 is constructed as one CPU in terms of hardware, it is possible to divide the processing capability of the CPU 30 into a plurality of virtual CPUs included in the CPU 30 by using a virtualization technology. For example, when a virtual CPU_V1 and a virtual CPU_V2 are formed by using the same CPU 30 (i.e., by using one CPU 30), the virtual CPU_V1 and the virtual CPU_V2 function as first and second masters, respectively. Note that the number of virtual CPUs is also arbitrarily determined.

According to the above-described embodiment, it is possible to provide a semiconductor device including a flash memory disposed therein and a flash-memory control method capable of achieving a stable operation in the semiconductor device.

Second Embodiment

Next, a second embodiment is explained.

In a semiconductor device according to the second embodiment, a configuration of a memory controller differs from that of the semiconductor device 1 explained above in the first embodiment. The rest of the configuration is similar to that of the semiconductor device according to the first embodiment and hence duplicate explanations are omitted as appropriate.

Figure 8:
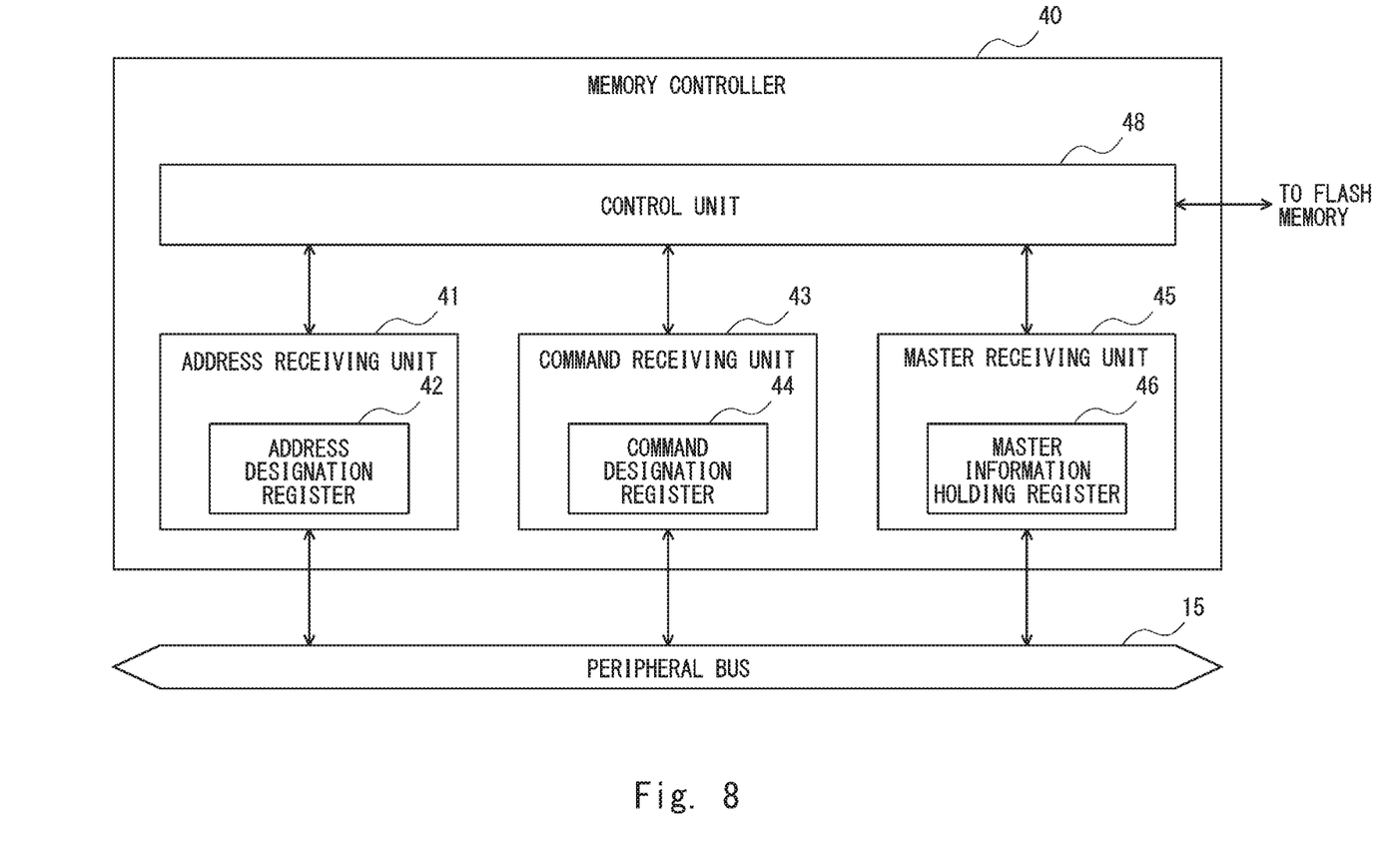
FIG. 8 is a block diagram showing a memory controller included in the semiconductor device according to a second embodiment.

FIG. 8 is a block diagram showing a memory controller 40 included in the semiconductor device according to this embodiment. As shown in FIG. 8, a memory controller 40 includes an address receiving unit 41, a command receiving unit 43, a master receiving unit 45, and a control unit 48.

The address receiving unit 41 includes an address designation register 42. Note that configurations and operations of the address receiving unit 41 and the address designation register 42 are similar to those of the address receiving unit 21 and the address designation register 22 shown in FIG. 2, and therefore duplicated explanations of them are omitted.

The command receiving unit 43 includes a command designation register 44. A command like ones shown in FIG. 9, i.e., "(A) data write command" or "(B) data erase command" is written into the command designation register 44. Note that configurations and operations of the command receiving unit 43 and the command designation register 44 are similar to those of the command receiving unit 23 and the command designation register 24 shown in FIG. 2, and therefore duplicated explanations of them are omitted.

The master receiving unit 45 includes a master information holding register 46. The master information holding register 46 is a register that holds (i.e., stores) information on a master that is accessing the flash memory 12, i.e., a master (the CPU 10_1 or 10_2 shown in FIG. 1) that is performing a writing/erasing process for the flash memory 12. Each of the CPU 10_1 and 10_2 outputs address data and write data (a command) to the peripheral bus 15 when it accesses the flash memory 12. In this process, the master information holding register 46 receives information on the master that has issued the command (information on the CPU at the command issuing source) (hereinafter also referred to as master information) from the peripheral bus 15. For example, the master information is master information that is provided through a signal line of the peripheral bus 15.

The control unit 48 controls the flash memory 12. Specifically, the control unit 48 performs control corresponding to the series of write data (the command) written in the command designation register 44 for the address in the flash memory 12 indicated by the address data written in the address designation register 42.

Further, when the control unit 48 receives an interrupt command for interrupting a writing/erasing process in execution, it determines whether or not to prohibit the interruption of the writing/erasing process in execution based on a result of a comparison between a master (e.g., a name of a master) held in the master information holding register 46 and a master (e.g., a name of a master) that has transmitted the interrupt command.

Specifically, when the master held in the master information holding register 46 differs from the master that has transmitted the interrupt command, the control unit 48 prohibits the interruption of the writing/erasing process in execution. On the other hand, when the master held in the master information holding register 46 is the same as the master that has transmitted the interrupt command, the control unit 48 permits the interruption of the writing/erasing process in execution.

Figure 10:
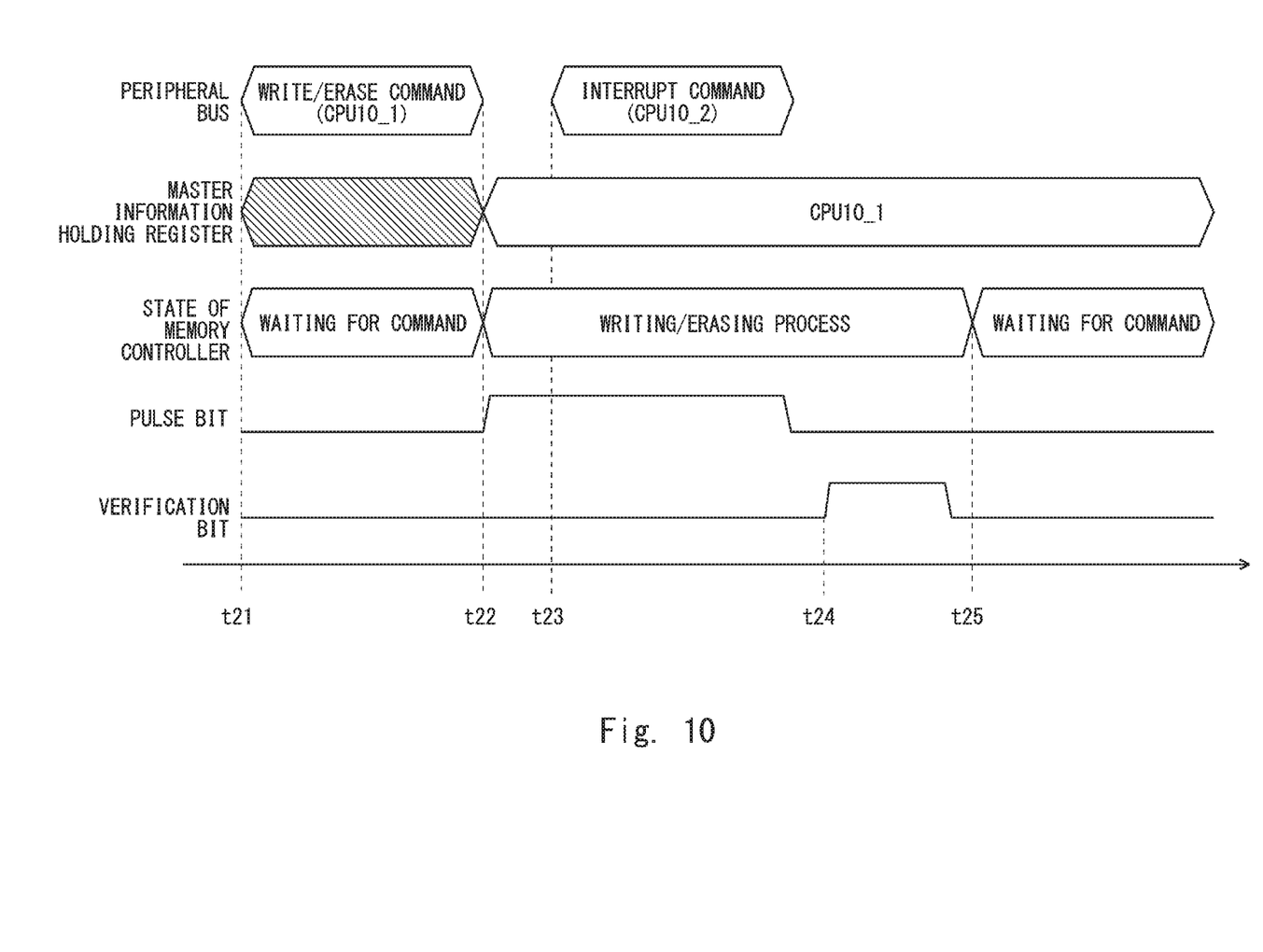
FIG. 10 is a timing chart for explaining an operation for a writing/erasing process for a flash memory.
Figure 11:
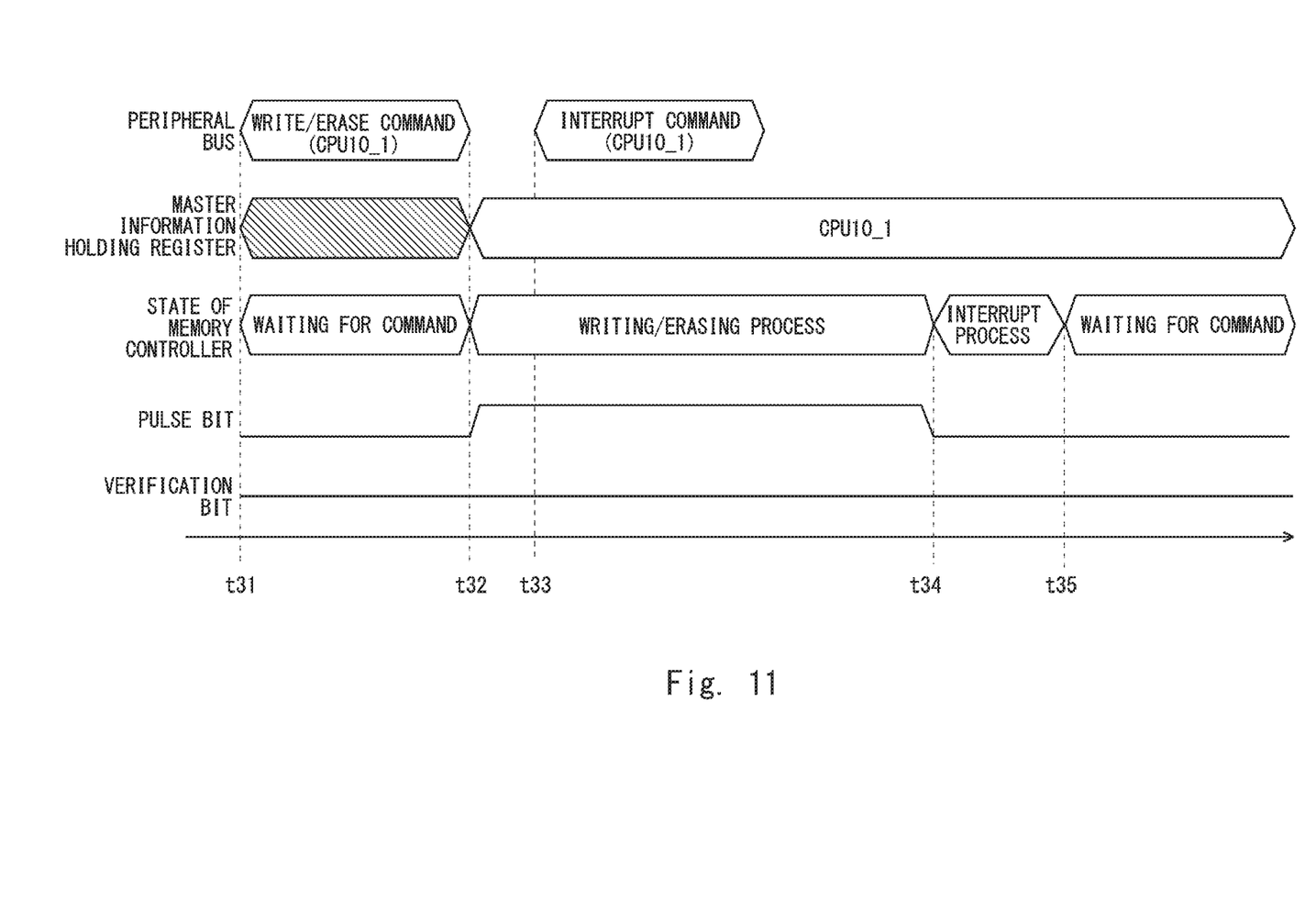
FIG. 11 is a timing chart for explaining an operation for a writing/erasing process for a flash memory.

Next, operations performed by the semiconductor device according to this embodiment are explained with reference to FIGS. 10 and 11. FIG. 10 is a timing chart for explaining an operation for a writing/erasing process for the flash memory 12, and shows an operation that is performed when the master held in the master information holding register 46 differs from the master that has transmitted the interrupt command. FIG. 11 is a timing chart for explaining an operation for a writing/erasing process for the flash memory 12, and shows an operation that is performed when the master held in the master information holding register 46 is the same as the master that has transmitted the interrupt command.

Firstly, the operation shown in FIG. 10 is explained. When the memory controller 40 is not performing a writing/erasing process for the flash memory 12, the memory controller 40 is in a waiting state (a command waiting state). In this state, when the CPU 10_1 outputs a writing/erasing process command (see FIG. 9) to the peripheral bus 15 (at a timing t21), the memory controller receives the writing/erasing process command through the peripheral bus 15. In this process, the CPU 10_1 also outputs address data to the peripheral bus 15.

Upon receiving the address data from the peripheral bus 15, the memory controller 40 writes the address data into the address designation register 42 (see FIG. 8). As a result, an address in the address space of the flash memory 12 into which data is written is specified. It should be noted that in the case of a data erasing process, data is erased on a block-by-block basis. Therefore, in the address space of the flash memory 12, an address of a block containing data to be erased is specified.

Figure 9:
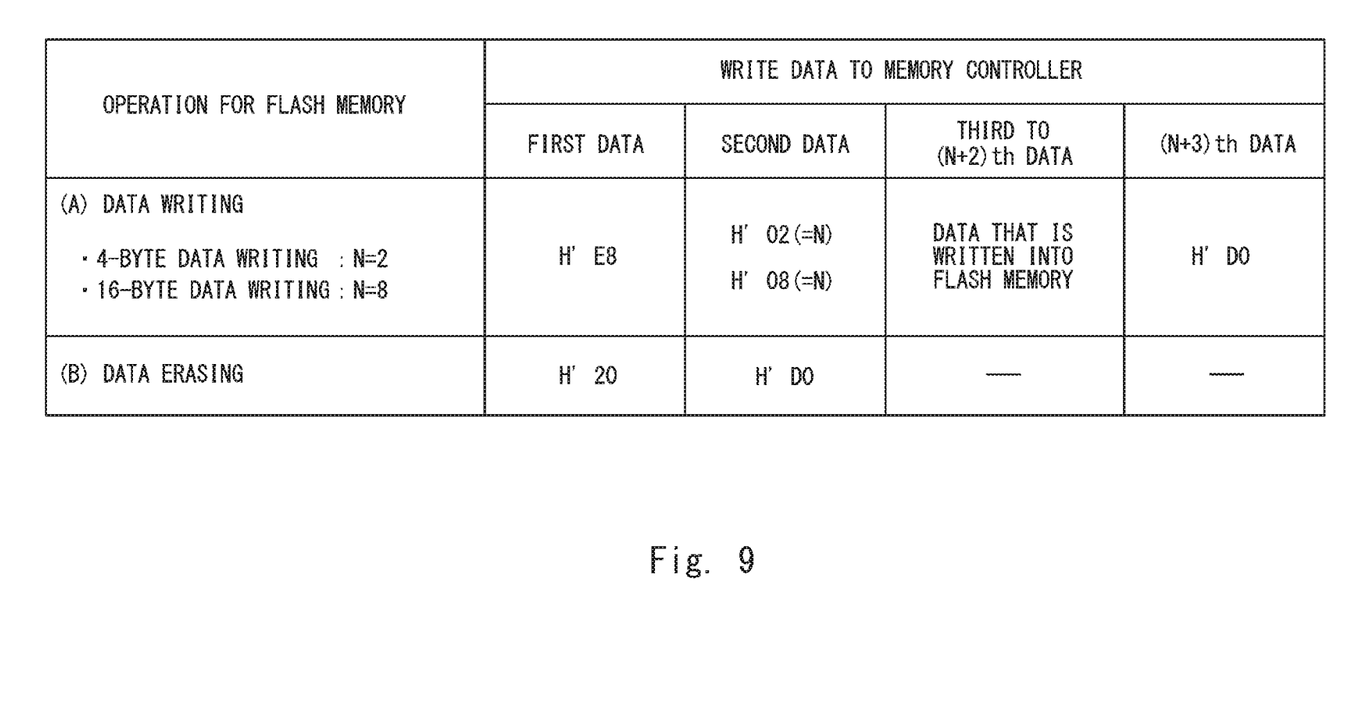
FIG. 9 is a table showing an example of commands used in the semiconductor device according to the second embodiment.

Further, upon receiving the writing/erasing process command from the peripheral bus 15, the memory controller 40 writes the writing/erasing process command (specifically "(A) data write command" or "(B) data erase command" shown in FIG. 9) into the command designation register 44 (see FIG. 8) (at a timing t22). In this way, the writing/erasing process is performed.

Specifically, the control unit 48 of the memory controller 40 performs the writing/erasing process corresponding to the command written in the command register specified 44 for the address indicated by the address data written in the address designation register 42. In this process, the memory controller 40 raises a pulse bit for indicating application of a write/erase pulse (a voltage) to the flash memory 12 to a high level for a predetermined period. As a result, the flash memory 12 starts the writing/erasing process. Note that operations that are performed when writing/erasing processes are performed by using the aforementioned commands are similar to those that are performed when writing and erasing processes are performed by using the "(A) data write command" and "(B) data erase command" shown in FIG. 3. Therefore, duplicated explanations of them are omitted.

Further, the master information holding register 46 receives information on the master (the CPU 10_1) that has issued the command in the above-described process (at the timing t21) from the peripheral bus 15 and holds the received information.

In this state, when an interrupt command is output from the CPU 10_2 to the peripheral bus 15, the memory controller 40 receives the interrupt command output form the CPU 10_2 through the peripheral bus 15 (at a timing t23). Then, the memory controller 40 compares the master information (the CPU 10_1) stored in the master information holding register 46 with the information of the master (the CPU 10_2) that has transmitted the interrupt command. In this case, since the master information (the CPU 10_1) stored in the master information holding register 46 differs from the information of the master (the CPU 10_2) that has transmitted the interrupt command, the memory controller 40 ignores the interrupt command transmitted from the CPU 10_2 and hence continues the writing/erasing process for the flash memory 12 performed by the CPU 10_1.

After the predetermined period has elapsed, the memory controller 40 lowers the pulse bit, which is being supplied to the flash memory 12, to a low level. As a result, the writing/erasing process for the flash memory 12 is finished. After that, at a timing t24, the memory controller 40 outputs a verification bit having a high level to the flash memory 12. As a result, it is verified whether or not the writing/erasing process for the flash memory 12 has been properly performed. Upon completing the verification process, the memory controller 40 becomes a waiting state (a command waiting state) again (at a timing t25).

Through the above-described operation, the writing/erasing process for the flash memory 12 is performed. In the operation shown in FIG. 10, the master (the CPU 10_1) held in the master information holding register 46 differs from the master (the CPU 10_2) that has transmitted the interrupt command, the interruption of the currently-processed writing/erasing process is prohibited.

Next, an operation that is performed when the master held in the master information holding register 46 is the same as the master that has transmitted the interrupt command is explained with reference to a timing chart shown in FIG. 11.

When the memory controller 40 is not performing a writing/erasing process for the flash memory 12, the memory controller 40 is in a waiting state (a command waiting state). In this state, when the CPU 10_1 outputs a writing/erasing process command (see FIG. 9) to the peripheral bus 15 (at a timing t31), the memory controller 40 receives the writing/erasing process command through the peripheral bus 15. In this process, the CPU 10_1 also outputs address data to the peripheral bus 15.

Upon receiving the address data from the peripheral bus 15, the memory controller 40 writes the address data into the address designation register 42 (see FIG. 8). As a result, an address in the address space of the flash memory 12 into which data is written is specified. It should be noted that in the case of a data erasing process, data is erased on a block-by-block basis. Therefore, in the address space of the flash memory 12, an address of a block containing data to be erased is specified.

Further, upon receiving the writing/erasing process command from the peripheral bus 15, the memory controller 40 writes the writing/erasing process command (specifically "(A) data write command" or "(B) data erase command" shown in FIG. 9) into the command designation register 44 (see FIG. 8) (at a timing t32). In this way, the writing/erasing process is performed.

Specifically, the control unit 48 of the memory controller 40 performs the writing/erasing process corresponding to the command written in the command register specified 44 for the address indicated by the address data written in the address designation register 42. In this process, the memory controller 40 raises a pulse bit for indicating application of a write/erase pulse (a voltage) to the flash memory 12 to a high level for a predetermined period. As a result, the flash memory 12 starts the writing/erasing process. Note that operations that are performed when writing/erasing processes are performed by using the aforementioned commands are similar to those that are performed when writing and erasing processes are performed by using the "(A) data write command" and "(B) data erase command" shown in FIG. 3. Therefore, duplicated explanations of them are omitted.

Further, the master information holding register 46 receives information on the master (the CPU 10_1) that has issued the command in the above-described process (at the timing t31) from the peripheral bus 15 and holds the received information.

In this state, when an interrupt command is output from the CPU 10_1 to the peripheral bus 15, the memory controller 40 receives the interrupt command output form the CPU 10_1 through the peripheral bus 15 (at a timing t33). Then, the memory controller 40 compares the master information (the CPU 10_1) stored in the master information holding register 46 with the information of the master (the CPU 10_1) that has transmitted the interrupt command. In this case, since the master information (the CPU 10_1) stored in the master information holding register 46 is the same as the information of the master (the CPU 10_1) that has transmitted the interrupt command, the memory controller 40 permits the interrupt request transmitted from the CPU 10_1 and hence interrupts the writing/erasing process for the flash memory 12 performed by the CPU 10_1.

That is, when the memory controller 40 receives the interrupt command while the pulse bit is at the high level, the memory controller 40 maintains the pulse bit at the high level for a predetermined time and then performs an interrupt process such as saving of address information (at a timing t34). After completing the interrupt process, the memory controller 40 enters a command waiting state (at a timing t35). While the interrupt process is being performed, the CPU 10_1 can perform a reading/writing/erasing process for the flash memory 12 (this process is omitted in the figure).

Note that subsequent processes (such as a resuming process) are similar to those performed at and after the timing t107 in FIG. 5, and therefore duplicate explanations of them are omitted.

Through the above-described operation, the writing/erasing process for the flash memory 12 is performed. In the operation shown in FIG. 11, the master (the CPU 10_1) held in the master information holding register 46 is the same as the master (the CPU 10_1) that has transmitted the interrupt command, the interruption of the currently-processed writing/erasing process is permitted.

In the semiconductor device according to this embodiment, it is also possible to prevent a process for writing/erasing important data to/from the flash memory from being interrupted halfway through the process and hence to prevent a problem related to the whole system from occurring. Therefore, it is possible to provide a semiconductor device including a flash memory disposed therein and a flash-memory control method capable of achieving a stable operation in the semiconductor device.

Further, in the semiconductor device according to this embodiment, a master can interrupt a writing/erasing process that is being performed by the same master (i.e., the master itself) as shown in FIG. 11. Therefore, when a process having a priority higher than that of the currently-processed writing/erasing process occurs and the master that is performing that currently-processed writing/erasing process has a priority higher than that of the other master, that master can interrupt that currently-processed writing/erasing process performed by that master itself. Therefore, it is possible to appropriately control writing/erasing processes for the flash memory while taking the priority of each process into consideration.

Note that in this embodiment, if it is desired to prohibit an interrupt process by the same master, "(C) interrupt prohibition+data write command" and "(D) interrupt prohibition+data erase command" shown in FIG. 3 may be added.

Further, in this embodiment, when it is determined whether or not a writing/erasing process in execution should be interrupted based on a result of a comparison between a master held in the master information holding register 46 and a master that has transmitted the interrupt command, a priority of each master may be used.

For example, information on a priority of each master may be stored in the control unit 48 included in the memory controller 40 in advance and the control unit 48 may determine whether or not to prohibit an interruption of a writing/erasing process in execution based on a result of a comparison between a priority of a master held in the master information holding register 46 and a priority of a master that has transmitted the interrupt command.

Specifically, the memory controller 40 may prohibit an interruption of a writing/erasing process in execution when a priority of a master held in the master information holding register 46 is higher than a priority of a master that has transmitted the interrupt command. Further, the memory controller 40 may permit an interruption of a writing/erasing process in execution when a priority of a master held in the master information holding register 46 is lower than a priority of a master that has transmitted the interrupt command.

The first and second embodiments can be combined as desirable by one of ordinary skill in the art.

While the present disclosure has been described in terms of several embodiments, those skilled in the art will recognize that the present disclosure can be practiced with various modifications within the spirit and scope of the appended claims and the present disclosure is not limited to the examples described above. Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   first and second masters capable of performing a predetermined process;
   a data-rewritable flash memory; and
   a memory controller configured to control a writing/erasing process for the flash memory performed by the first or second master, wherein
   the memory controller is configured so that while the first master is performing a writing/erasing process for the flash memory, the memory controller can prohibit an interruption of the writing/erasing process in execution, the interruption resulting from access to the flash memory by the second master,
   the memory controller comprises a master information holding register configured to store information on a master performing a writing/erasing process for the flash memory, and
   when the memory controller receives an interrupt command for interrupting the writing/erasing process in execution, the memory controller determines whether or not to interrupt the writing/erasing process in execution based on a result of a comparison between a master held in the master information holding register and a master that has transmitted the interrupt command.

2. The semiconductor device according to claim 1, wherein when a command received from the first master prohibits an interruption of the writing/erasing process, the memory controller prohibits, while the first master is performing the writing/erasing process for the flash memory, an interruption of the writing/erasing process in execution.

3. The semiconductor device according to claim 2, wherein
   the memory controller comprises a command designation register into which a command received from the first or second master is written, and
   when a command received from the first master and written into the command designation register prohibits an interruption of the writing/erasing process, the memory controller prohibits, while the first master is performing the writing/erasing process for the flash memory, an interruption of the writing/erasing process in execution.

4. The semiconductor device according to claim 1, wherein the memory controller prohibits an interruption of the writing/erasing process in execution when the master held in the master information holding register differs from the master that has transmitted the interrupt command.

5. The semiconductor device according to claim 1, wherein the memory controller permits an interruption of the writing/erasing process in execution when the master held in the master information holding register is the same as the master that has transmitted the interrupt command.

6. The semiconductor device according to claim 1, wherein the memory controller prohibits an interruption of the writing/erasing process in execution when a priority of the master held in the master information holding register is higher than a priority of the master that has transmitted the interrupt command.

7. The semiconductor device according to claim 1, wherein the memory controller permits an interruption of the writing/erasing process in execution when a priority of the master held in the master information holding register is lower than a priority of the master that has transmitted the interrupt command.

8. The semiconductor device according to claim 1, wherein the memory controller prohibits an interruption of the writing/erasing process in execution when data that the first master is writing/erasing to/from the flash memory contains at least one of flag data and security-key data.

9. The semiconductor device according to claim 1, wherein
   the first master is formed by using a first processor, and
   the second master is formed by using a second processor.

10. The semiconductor device according to claim 1, wherein
    the first master is a first virtual CPU,
    the second master is a second virtual CPU, and
    the first and second virtual CPUs are formed by using one processor.

* * * * *